United States Patent [19]

Foss

[11] 4,247,624
[45] Jan. 27, 1981

[54] PHOTOPOLYMERIZABLE ELASTOMERIC COMPOSITIONS WITH CARBAMATED POLY(VINYL ALCOHOL) BINDER

[75] Inventor: Robert P. Foss, Hockessin, Del.

[73] Assignee: E. I. Du Pont de Nemours and Company, Wilmington, Del.

[21] Appl. No.: 42,943

[22] Filed: May 29, 1979

[51] Int. Cl.³ ............................................. G03C 1/68
[52] U.S. Cl. ................................. 430/281; 204/159.12; 204/159.15; 204/159.19; 204/159.23; 430/905; 430/906; 430/909; 525/61
[58] Field of Search ............... 96/33, 35.1, 36, 36.2, 96/36.3, 36.4, 38.1, 86 P, 87 R, 115 P; 204/159.12, 159.15, 159.16, 159.23, 159.19; 430/281, 283, 285, 905, 906, 909; 525/61

[56] References Cited

U.S. PATENT DOCUMENTS

| | | | |
|---|---|---|---|
| 1,902,889 | 3/1933 | Paquin | 528/261 |
| 1,924,253 | 8/1933 | Paquin | 528/367 |
| 1,986,067 | 1/1935 | Paquin | 528/261 |
| 3,193,534 | 7/1965 | Matsubayashi et al. | 525/61 |
| 3,352,828 | 11/1967 | Passannante | 525/61 X |
| 3,392,151 | 7/1968 | Minsk et al. | 96/94 X |
| 3,449,126 | 6/1969 | Minsk | 96/109 |
| 3,547,642 | 12/1970 | Nishio | 96/87 R X |
| 3,597,215 | 8/1971 | Abel et al. | 96/87 R X |
| 3,743,627 | 7/1973 | Smith et al. | 525/61 X |
| 3,905,819 | 9/1975 | Sakurai et al. | 96/35.1 |
| 4,043,819 | 8/1977 | Baumann | 96/115 P |
| 4,058,443 | 11/1977 | Murata et al. | 204/159.16 X |
| 4,109,068 | 8/1978 | Allen | 430/909 X |

FOREIGN PATENT DOCUMENTS 1351475 5/1974 United Kingdom .
1416440 12/1975 United Kingdom .

Primary Examiner—Edward C. Kimlin

[57] ABSTRACT

Flexographic printing plates are prepared from photosensitive elastomeric compositions which comprise
(1) about 15 to about 89 percent by weight of a carbamated poly(vinyl alcohol) polymeric binder,
(2) about 10 to about 70 percent by weight of a compatible monomer, and
(3) about 0.1 to about 10 percent by weight of a free-radical generating system.

6 Claims, No Drawings

PHOTOPOLYMERIZABLE ELASTOMERIC COMPOSITIONS WITH CARBAMATED POLY(VINYL ALCOHOL) BINDER

TECHNICAL FIELD

This invention relates to photopolymerizable compositions, and to photopolymerizable elements prepared therefrom. More particularly, this invention relates to such compositions and elements which are useful as flexographic printing plates.

BACKGROUND ART

Partially carbamated esters of poly(vinyl alcohol) have been previously employed as binders in photopolymerizable compositions. For example, British Patent Specifications Nos. 1,351,475, and 1,416,440, disclose photopolymerizable compositions which comprise an aqueous solution of a water-soluble polymer which may be a partially carbamated ester of poly(vinyl alcohol); a water-soluble acrylic monomer which may contain a hydroxyl group; and a dispersion of a water-insoluble photopolymerization initiator. Elements which comprise a layer of the photopolymerizable composition in a dried form on a support are also disclosed. The compositions are prepared in aqueous solution at 60° C. and do not contain grafted carbonate or N-substituted carbamate groups.

Partially carbamated and N-substituted carbamated esters of poly(vinyl alcohol) have been employed in gelatin-silver halide photographic materials. U.S. Pat. Nos. 3,597,215 and 3,392,151 disclose the use of carbamate, N-alkyl and N-amidoalkyl or hydrazidoalkyl-substituted carbamates to improve covering power and sensitometric properties of photographic silver halide materials. U.S. Pat. No. 3,449,126 discloses the use of N-carboxyalkyl carbamated poly(vinyl alcohol) polymers as novel fog-inhibiting agents in photographic silver halide emulsions, and U.S. Pat. No. 3,547,642 discloses the use of methylol poly(vinyl urethane) in combination with gelatin to provide good dimensional stability and less curling tendency for photographic materials.

Elastomeric photopolymerizable compositions which contain a partially carbamated ester of poly(vinyl alcohol) grafted with carbonate groups have not heretofore been described as binders for photopolymerizable compositions.

DISCLOSURE OF INVENTION

According to the present invention there is provided a photosensitive elastomeric composition which comprises, based on the total composition:

(1) about 15 to about 89 percent by weight of a carbamated poly(vinyl alcohol) polymeric binder wherein
  (a) about 15 to about 100 mole percent of the recurring units in said binder have the formula

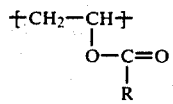

wherein R is selected from the group consisting of $NH_2$, $OR^1$, and $NHR^1$ wherein $OR^1$ is the residue remaining after removal of a hydrogen atom from an alcohol which has a boiling point of greater than 100° C. at normal atmospheric pressure, with the proviso that said alcohol is compatible with said polymeric binder, and the ratio of $(OR^1+NHR^1)/NH_2$ is within the range of about 0.05 to about 1.0, and (b) 0 to about 85 mole percent of the recurring units in said binder have a formula selected from the group consisting of

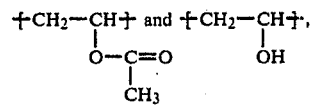

with the proviso that no more than about 12 mole percent of the recurring units in said binder have the formula

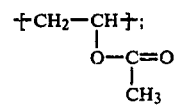

(2) about 10 to about 70 percent by weight of a non-gaseous, ethylenically unsaturated compound containing at least one terminal ethylenic group, said compound being capable of forming a high polymer by radical initiated chain-propagating addition polymerization, and being compatible with polymeric binder (1);

(3) about 0.1 to about 10 percent by weight of a thermally stable, radiation-sensitive, radical generating system, activatable by actinic radiation, which initiates polymerization of the unsaturated compound. The photosensitive elastomeric compositions of this invention containing a carbamated poly(vinyl alcohol) binder differ from the photosensitive compositions of the art which contain a carbamated poly(viny alcohol) binder in that the binder also contains carbonate ester and/or N-substituted carbamated groups. The incorporation of the ester and N-substituted carbamate groups prepared from alcohols compatible with the binder, optionally and preferably together with a compatible hydroxylic plasticizer, give a binder with elastomeric properties, and the resulting photosensitive compositons are readily processed into useful elements comprising a substrate bearing a layer of the photosensitive composition. Furthermore, when elements of this invention are imagewise exposed to actinic radiation, the exposed areas become insoluble and tough, shaped elastomeric reliefs are obtained upon subsequent solvent removal of unexposed portions of the composition. The unexposed areas of the photosensitive element are soluble in water, and hence they may be removed after exposure by washing with water. An additional advantage of the photosensitive compositions of this invention is that they are relatively insensitive to oxygen, i.e., they show essentially equivalent photospeeds when exposed in air, vacuum or a helium atmosphere.

One of the essential ingredients in the compositions of this invention is a carbamated poly(vinyl alcohol) polymeric binder wherein about 15 to about 100 mole percent, preferably about 30 to about 50 mole percent, of the recurring units in the binder have the formula

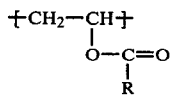

wherein R is $NH_2$, $OR^1$ or $NHR^1$ and $OR^1$ is the residue remaining after removal of the hydrogen atom from an alcohol which has a boiling point greater than 100° C. at normal atmospheric pressure, with the proviso that said alcohol is compatible with said polymeric binder; and the ratio of $(OR^1+NHR^1)/NH_2$ is within the range of about 0.05–1.0, preferably about 0.1 to 0.3, and 0 to about 85 mole percent, preferably about 50 to about 70 mole percent, of the recurring units in said binder have a formula selected from the group consisting of

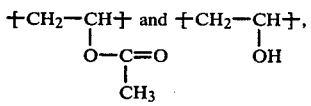

with the proviso that no more than 12 mole percent of the recurring units in said binder have the formula

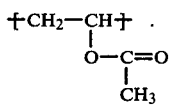

The polymeric binder preferably has a number average molecular weight within the range of about 10,000 to about 100,000. Generally, the polymeric binder constitutes about 15 to about 89 and preferably about 30 to about 70 percent by weight of the photosensitive composition.

The carbamated poly(vinyl alcohol) polymeric binder may be prepared by reaction of poly(vinyl alcohol), either partially acetylated or completely hydrolyzed, with urea to obtain the carbamate ester followed by reaction of the carbamate ester with the suitable alcohol, $R^1OH$, to convert a portion of the carbamate ester groups to carbonate ester or N-substituted carbamate groups, as shown in equations (a), (b), and (c). It is believed that only a minor number of N-substituted carbamate groups are formed (equation c).

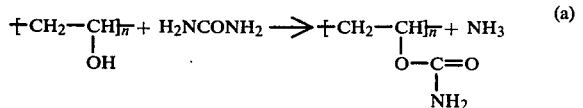

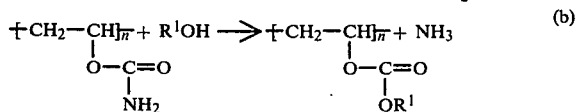

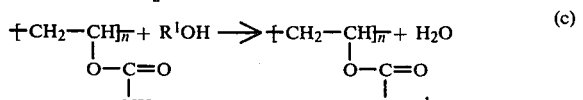

Carbamation of poly(vinyl alcohol) with urea is known and has been described, e.g., by Paquin, Zeitschrift für Naturforschung, Vol. 1, pages 518–523 (1946), and by Abel et al. in U.S. Pat. No. 3,597,215. It is preferred to carry out the carbamation reaction of poly(vinyl alcohol) in molten urea at 155°–165° C. in the presence of a Lewis acid catalyst, preferably zinc acetate. The degree of substitution obtained is determined by the reaction time which is preferably about 0.5–4 hrs.

A suitable solvent for the carbamation reaction may be employed, preferably dimethylformamide. Foaming caused by evolution of ammonia is greatly reduced or eliminated, and no crusting of unreacted materials occurs when a solvent is employed. The carbamate ester is easily isolated by precipitation from a methanol/acetone solvent mixture.

Grafting by formation of carbonate ester or N-substituted carbamate groups to the polymeric binder is accomplished by reaction of an alcohol, preferably a primary alcohol, with the carbamate groups of the polymer with evolution of ammonia or water as shown in equations (b) and (c). The reaction is usually carried out at elevated temperatures, preferably about 130° to 160° C., for a time sufficient to effect the degree of substitution desired, e.g., about 5–90 minutes.

Suitable alcohols for use in the grafting reaction, and as plasticizers, are those which have a boiling point greater than 100° C. at normal atmospheric pressure and which are compatible with the polymeric binder. By "compatible" is meant the ability of two or more constituents to remain dispersed in one another without causing significant amounts of scattering of actinic radiation. Compatibility is often determined by the relative proportions of these constituents. Incompatibility is evidenced by formation of haze or opalescence in the photosensitive composition, although some slight haze can be tolerated from such compositions before or during exposure in the preparation of printing reliefs.

Preferred alcohols include glycerol, glycols of 2 to 4 carbon atoms such as ethylene glycol and propylene glycol, and unsaturated esters of glycols and polyols, especially such esters of alpha-methylene carboxylic acids and substituted alpha-methylene carboxylic acids, more especially such esters of alkylene polyols and polyalkylene polyols, and esters such as polyol mono-, di, and tri-acrylates and polyalkylene polyol mono-, di, and tri-methacrylates prepared from alkylene polyols of 2–15 carbon atoms or polyalkylene ether polyols or glycols of 1–10 ether linkages.

The following specific compounds are further illustrative of this class: ethylene glycol monoacrylate, ethylene glycol monomethacrylate, diethylene glycol monoacrylate, diethylene glycol monomethacrylate, glycerol monoacrylate, glycerol monomethacrylate, glycerol diacrylate, glycerol dimethacrylate, trimethylolpropane monoacrylate, trimethylolpropane monomethacrylate, 1,3-propanediol monoacrylate, 1,3-propanediol monomethacrylate, 1,2,4-butanetriol monomethacrylate, petaerythritol triacrylate, pentaerythritol monomethacrylate, and the like.

Another essential ingredient of the photosensitive compositions of the invention is a non-gaseous, ethylenically unsaturated compound containing at least one terminal ethylenic group, said compound being capable of forming a high polymer by radical initiated, chain-propagating addition polymerization and being compatible with the polymeric binder. Preferred for use as ethylenically unsaturated compounds are the alcohols, $R^1OH$, which are employed for grafting of carbonate ester or N-substituted carbamate groups to the polymeric binder and which contain at least one terminal ethylenic group, especially hydroxyl-containing unsaturated esters of alpha-methylene carboxylic acids and substituted alpha-methylene carboxylic acids, as described heretofore. Such ethylenically unsaturated compounds exhibit good compatibility with the polymeric binder. It is likewise preferred to employ mixtures of these ethylenic unsaturated compounds with up to about 5 percent by weight of nonhydroxyl-containing ethylenically unsaturated compound, e.g., ethylene glycol diacrylate and ethylene glycol dimethacrylate, in amounts such that compatibility with the polymeric binder is retained.

The amount of ethylenically unsaturated compound added should be in the range of about 10 to about 70 percent by weight, based on the total composition. The specific amount for optimum results will vary depending upon the degree of carbamation of the binder and the ratio of carbonate and N-substituted carbamate to carbamate groups. Preferably the amount of unsaturated compound is in the range of about 20 to about 40 percent.

The ethylenically unsaturated compound preferably has a boiling point of greater than 100° C. at normal atmospheric pressure. The most preferred ethylenically unsaturated compounds are glycerol monomethacrylate, ethylene glycol monomethacrylate and 1,3-propanediol monomethacrylate.

Another essential ingredient of the photosensitive compositions of this invention is a thermally-stable, radiation-sensitive, radical generating system, activatable by actinic radiation, which initiates polymerization of the unsaturated compound. Because process transparencies transmit heat originating from conventional sources of actinic radiation, and since the photosensitive compositions are prepared under conditions resulting in elevated temperatures, the radical generating compounds are inactive thermally below 85° C., and more preferably below 185° C. They should be dispersible in the composition to the extent necessary for initiating the desired polymerization under the influence of the amount of radiation absorbed in relatively short term exposures. These initiators are useful in amounts from about 0.1 to about 10 percent by weight, and preferably from about 0.2 to about 1 percent based on the total weight of the solvent-free photosensitive composition.

The radical generating system absorbs radiation within the range of about 2000 to about 8000 Å and has at least one component that has an active radiation absorption band with a molar extinction coefficient of at least about 50 within the range of about 2500 to about 8000 Å, and preferably about 2500 to about 5000 Å. The term "active radiation absorption band" means a band of radiation which is active to produce the radicals necessary to initiate polymerization of the unsaturated material.

The radical generating system can comprise one or more compounds which directly furnish radicals when activated by radiation. It can also comprise a plurality of compounds, one of which yields the radicals after having been caused to do so by a sensitizer which is activated by the radiation.

A large number of such radical generating compounds can be utilized in the practice of the invention and include aromatic ketones such as benzophenone, Michler's ketone [4,4'-bis(dimethylamino)benzophenone], 4,4'-bis(diethylamino)benzophenone, 4-acryloxy-4'-dimethylaminobenzophenone, 4-acryloxy-4'-diethylaminobenzophenone, 4-methoxy-4'-dimethylaminobenzophenone, 2-ethylanthraquinone, phenanthraquinone, 2-t-butylanthraquinone, 1,2-benzanthraquinone, 2,3-benzathraquinone, 2,3-dichloronaphthoquinone, benzil dimethyl acetal, and other aromatic ketones; and benzoin, benzoin ethers such as benzoin methyl ether, benzoin ethyl ether, benzoin isobutyl ether, and benzoin phenyl ether, methylbenzoin, ethylbenzoin and other benzoins, particularly when used with a nitroso dimer inhibitor system. Preferred as a radical generating compound is benzophenone.

Optionally, the photosensitive compositons may also contain a small amount of thermal, addition polymerization inhibitor, e.g., 0.001% to 2.0%, based on the weight of the total solvent-free photosensitive composition. Suitable inhibitors include hydroquinone and alkyl and aryl-substituted hydroquinones, 2,6-di-tert-butyl-4-methylphenol, p-methoxyphenol, tert-butyl-pyrocatechol, pyrogallol, beta-naphthol, 2,6-di-tert-butyl-p-cresol, phenothiazine, pyridine, nitrobenzene, dinitrobenzene and the nitroso dimer inhibitor systems described in British Pat. No. 1,453,681. Other useful inhibitors include p-toluquinone, chloranil and thiazine dyes, e.g., Thionine Blue G (CI 52025), Methylene Blue B (CI 52015) and Toluidine Blue (CI 52040). Such compositions can be photopolymerized without removal of the inhibitor. The preferred inhibitor is hydroquinone.

The photosensitive compositions may also contain compatible plasticizers to control the modulus and other elastomeric properties of the polymeric binder. Preferred, because of their good compatibility with the binder and unsaturated compounds, are plasticizers containing hydroxyl, amino or amide groups, e.g., glycerol, ethylene glycol, propylene glycol, polyamide resins, and carbamate esters. Glycerol is a particularly preferred plasticizer.

Because an excess of urea may be employed in the preparation of carbamate esters of the binder, carbamates of other hydroxylic-containing components of the compositions may also be formed and be present in the photosensitive compositions. For example, carbamates of glycerol and hydroxyl-containing ethylenically unsaturated compounds may be formed during the grafting reaction when such components are employed. Any glycerol carbamate present functions as a compatible plasticizer, and carbamates of hydroxyl-containing ethylenically unsaturated compounds will photopolymerize the function as an ethylenically unsaturated compound.

Because of the excess of hydroxyl groups present in the polymeric binder, the photosensitive compositons of the invention both before and after exposure to radiation are sensitive to conditions of high humidity. Incorporation into the composition of a compatible polyamide resin gives compositions which exhibit considerably less sensitivity to moisture and high humidity. The polyamide filler also serves to increase toughness of the compositions and it functions as an adhesion promoter in the photosensitive elements when oriented polyester film is employed as a substrate. Preferably, about 5 to about 15 weight percent, based on the total photosensitive composition, of polyamide resin is employed.

Alternatively, elements of the invention, after exposure and development, may be protected from atmospheric moisture by coating the elements with a moisture-insensitive barrier layer polymer, preferably a polyamide. The developed plate may be sprayed with or dipped in an alcohol solution of the polyamide, and the plate dried. After drying, plates may be postexposed to further graft the barrier layer to the element.

Another effective method for decreasing the moisture sensitivity of compositions after exposure and development is by treating the elements with an aqueous solution of formaldehyde or butyraldehyde followed by drying and mild heating. Two reactions may occur, each of which reduces moisture sensitivity, and these are shown in equations (d) and (e).

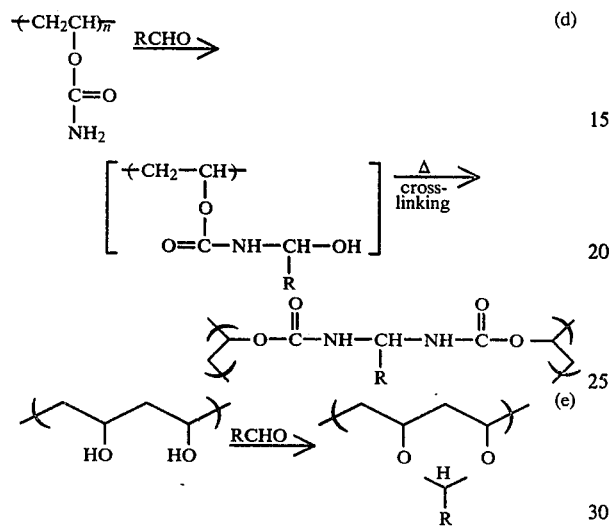

If desired, the photosensitive compositions can also contain immiscible, polymeric or nonpolymeric organic or inorganic fillers or reinforcing agents which are essentially transparent at the wavelengths used for exposure of the photosensitive layer and which do not scatter actinic radiation, e.g., polystyrene, the organophilic silicas, bentonites, silica, powdered glass, colloidal carbon, as well as various types of dyes and pigments. Such materials are used in amounts varying with the desired properties of the elastomeric compositions. The fillers are useful in improving the strength of the elastomeric layer, reducing tack and, in addition, as coloring agents.

The photosensitive compositions of this invention can be prepared in any suitable way by mixing the three essential components, i.e., (1) the carbamated poly(vinyl alcohol) polymeric binder, (2) the compatible ethylenically unsaturated compound, and (3) the radical generating system. For example, flowable compositions can be made by mixing them and other desired adjuvants in any order. Conventional milling, mixing, and solution techniques can be used in making these compositions, the particular technique varying with the differences in properties of the respective components. The homogeneous, essentially non-radiation-scattering compositions, are formed into sheets in any desired manner. For example, hot pressing, calendering, or extrusion are suitable methods for preparing layers of the desired thickness.

Two preparative procedures are preferred. In the first, a single-step procedure, the carbamated poly(vinyl alcohol) polymeric binder is prepared by reacting poly(vinyl alcohol) with urea without a solvent at about 155°-165° C. for about 30 minutes. To the reaction mixture is added the ethylenically unsaturated compound, the radical generating system, and any plasticizers or other desired adjuvants and after a reaction time of about 10-30 minutes at a temperature of about 145° to 165° C., the composition is extruded directly onto a substrate. Excessive reaction times should be avoided since cross-linking may occur with insolubilization of the binder.

In the second preferred procedure, a two-step process, carbamated poly(vinyl alcohol) is prepared, preferably using dimethylformamide solvent, and the polymer is isolated by pouring it into methanol or methanol/acetone mixtures. The separated polymer is added to the other components of the photosensitive composition, and the reaction mixture is milled at a temperature of about 135° to 160° C. to effect grafting of the binder and mixing of the components. The composition is subsequently extruded directly onto a substrate. It is preferred to evacuate the compositions before extrusion to remove trapped gaseous ammonia and air followed by extrusion with minimum reintroduction of air to prevent introduction of air bubbles into the extrudate.

The photosensitive elements of this invention can be made by extruding, calendering or pressing at an elevated temperature the photosensitive composition into the form of a layer or self-supporting sheet on a suitable casting wheel, belt or platen. The layer or sheet may be laminated to the surface of a suitable permanent substrate or, if necessary, it may be affixed by means of a suitable adhesive.

The thickness of the photosensitive layer is a direct function of the thickness desired in the relief image and this will depend on the subject being reproduced and the ultimate use of the relief, e.g., thick soft reliefs are useful for flexographic printing and thin hard reliefs are useful for planographic printing. In general, the thickness of the photosensitive layer will be less than about 250 mils, e.g., it will vary from about 0.5 to about 250 mils (12.7–6350 $\mu$m) and layers within this range of thickness will be used for the majority of the printing plates.

The photosensitive compositions described herein may be applied to a wide variety of substrates. By "substrate" is meant any natural or synthetic support, especially one which is capable of existing in a flexible or rigid film or sheet form. Suitable substrates include metals, e.g., steel and aluminum plates, sheets and foils, cellulose paper, fiberboard, and films or plates composed of various film-forming synthetic resins or high polymers, such as the addition polymers and in particular vinylidene chloride copolymers with vinyl chloride, vinyl acetate, styrene, isobutylene and acrylonitrile; vinyl chloride homopolymers and copolymers with vinyl acetate, styrene, isobutylene and acrylonitrile; linear condensation polymers such as polyesters, e.g., polyethylene terephthalate; polyamides, e.g., polyhexamethylenesebacamide; polyimides, e.g., films as disclosed in U.S. Pat. No. 3,179,634; and polyester amides, e.g., polyhexamethyleneadipamide adipate and the like, or a composite of two or more of these materials. Fillers or reinforcing agents can be present in the synthetic resin or polymer bases such as the various fibers (synthetic, modified, or natural), e.g., cellulosic fibers, for instance, cotton, cellulose acetate, viscose rayon; paper; glass wool; nylon and polyethylene terephthalate. These reinforced bases may be used in laminated form. Other substrates include copper, alumina-blasted aluminum, oriented polyester film, alumina-blasted oriented polyester film, polyvinylidene chloride-coated oriented polyester film, poly(vinyl alcohol)-coated paper, crosslinked polyester-coated paper, nylon, glass, heavy paper such as lithographic paper, polypropylene film, silicon wafers, and the like. Various anchor layers disclosed in U.S. Pat. No. 2,760,863 can be used to give strong adherence between the substrate and the photosensitive layer or, in the case of a transparent substrate, pre-exposure through the substrate to actinic radiation may be useful. The adhesive compositions disclosed in U.S. Pat. No. 3,036,913 are also effective.

When highly reflective substrates are used, oblique rays passing through clear areas in the process transparency will strike the surface of the base at an angle other than 90°, and after reflection they will cause polymerization in the nonimage areas. This disadvantage can be overcome when the photosensitive layer is on a radiation-reflective substrate by an intervening stratum sufficiently adsorptive of actinic radiation so that less than 35% of the incident radiation is reflected. The layer absorptive of reflected radiation or nonradiation scattering layer, or antihalation layer, can be made by dispersing a finely-divided dye or pigment which substantially absorbs actinic radiation in a solution or aqueous dispersion of a resin or polymer which is adherent to both the substrate and the photoinsolubilized image and coating it on the substrate to form an anchor layer which is dried.

The antihalation layer may be made in the various manners described in U.S. Pat. Nos. 2,760,863, 2,791,504 and 3,024,180. The photosensitive layer itself can serve as the light absorption layer, e.g., when dyes or pigments are included in the photosensitive composition or when the layer is sufficiently thick. Suitable antihalation pigments include carbon black, manganese dioxide, dyes, e.g., Acid Blue Black (CI 20470) and Acid Magenta O (CI 42685). A dyed metal plate is also useful.

The antihalation layer intermediate between the photosensitive layer and the substrate when used must have adequate adhesion to the substrate and the photosensitive layer and not react with the radiation-absorptive material. Suitable polymeric or resin carriers for the radiation-absorptive dyes or pigments which can be used include polymers of vinyl compounds, e.g., polyvinyl chloride homopolymers, and copolymers, e.g., vinyl chloride with vinyl acetate, diethyl fumarate or ethyl acrylate. Copolymers of acrylic and methacrylic acid may also be used.

The photosensitive compositions are, in general, solids. They are also, frequently, depending on their composition, somewhat tacky on the surface. This latter property is of advantage in that compositions adhere of themselves to a substrate being used and do not usually require the application of an adhesive to retain them on the substrate, both during photoexposure and development steps and during subsequent use of the insolubilized material as a printing plate. The elements of the invention may be provided with a transparent flexible cover sheet such as a thin film of a perfluorinated ethylene/propylene copolymer, polystyrene, polyethylene, polypropylene, polyethylene terephthalate or other strippable material on the side of the photosensitive layer remote from the substrate to prevent contamination of or damage to the photosensitive layer during storage or manipulation. The elements may also be provided with a thin, hard, flexible, solvent-soluble layer, such as a flexible, polymeric film or layer, e.g., of a polyamide or a copolymer of ethylene and vinyl acetate, or the known type of mold-release agents, e.g., certain commercially available silicones, which is interposed between the cover sheet, when present, and the upper surface of the photosensitive layer when it is desired to protect for reuse an image-bearing negative or transparency superposed thereon or to improve contact or alignment with the photosensitive surface. If desired, the photosensitive element can also have on the reverse surface of the substrate a pressure-sensitive adhesive layer provided with a protective strippable layer. Upon removal of the latter, the element can be processed onto or otherwise adhered to a permanent substrate, e.g., a printing block or metal plate.

Printing reliefs can be made in accordance with this invention by exposing to actinic radiation selected portions of a photosensitive layer of an element described above, for example, through a process transparency, i.e., an image-bearing transparency or stencil having areas essentially transparent to actinic radiation and of substantially uniform optical density and areas opaque to actinic radiation and of substantially uniform optical density until substantial addition-polymerization takes place. During the addition-polymerization, the carbamated poly(vinyl alcohol) polymeric binder/ethylenically unsaturated compound composition is converted to the insoluble state in the radiation-exposed portions of the layer, with no significant polymerization taking place in the unexposed portions or areas of the layer. The unexposed portions of the layer are removed by means of a solvent, preferably water, for the carbamated poly(vinyl alcohol) binder. The process transparency may be constructed of any suitable material including cellulose acetate film and oriented polyester film.

Actinic radiation from any source and of any type can be used in the photopolymerization process. The radiation may emanate from point sources or be in the form of parallel rays or divergent beams. By using a broad radiation source relatively close to the image-bearing transparency, the radiation passing through the clear areas of the transparency enters as divergent beams and thus irradiates a continually diverging area in the photopolymerizable layer underneath the clear portions of the transparency. This results in a polymeric relief having its greatest width at the bottom of the photopolymerizable layer, i.e., a frustum, the top surface of the relief being the dimensions of the clear area.

Inasmuch as the radical generating systems activatable by actinic radiation generally exhibit their maximum sensitivity in the ultraviolet range, the radiation source should furnish an effective amount of this radiation, preferably having a wavelength range between about 2500 Å and 5000 Å. Suitable sources of such radiation, in addition to sunlight, include carbon arcs, mercury-vapor arcs, fluorescent lamps with ultraviolet radiation-emitting phosphors, argon glow lamps, electron flash units and photographic flood lamps. Electron accelerators and electron beam sources through an appropriate mask may also be used. Of these, the mercury-vapor lamps, particularly the sun lamp or "black light" type, and the fluorescent sun lamps, are most suitable.

The radiation exposure time may vary from fractions of a second to minutes, depending upon the intensity and spectral energy distribution of the radiation, its distance from the composition and the nature and amount of the composition available. Customarily, a mercury vapor arc or a sunlamp is used at a distance of about 1.5 to about 60 inches (3.8–153 cm) from the photosensitive composition. Exposure temperatures are not particularly critical, but it is preferred to operate at about ambient temperatures or slightly higher, i.e., about 20° to about 35° C.

After exposure, the image may be developed by washing with a suitable solvent. The solvent liquid should have good solvent or swelling action on the carbamated poly(vinyl alcohol) binder/ethylenically unsaturated compound composition and little action on the insolubilized image or upon the substrate material, antihalation layer, or anchor layer, in the period required to remove the nonpolymerized portions. Preferred solvents include water and aqueous salt solutions, most preferably an aqueous 9% potassium chloride/1% potassium hydroxide solution or a 10% potassium chloride solution. The salt solutions effect more rapid development and have less of a swelling effect on the exposed portions of the plate. It is preferred to spray-develop the exposed plates at about 25° C. Development time can be varied but preferably is in the range of about 0.5 to about 3 minutes. The developed plates are normally air-dried at elevated temperature for a few minutes followed by a brief postexposure to help rigidify the background areas. Alternatively, depending upon application, development of the image after exposure may be carried out by toning, i.e., dusting with a fine pigment which selectively adheres to the tacky unpolymerized areas.

An additional posttreatment of the developed plate with formaldehyde may be carried out to effect further stabilization of the imaged areas by cross-linking via reaction with pendant carbamate and hydroxyl groups as shown in equations (d) and (e) above. A preferred procedure is treatment of the developed plate with a 1/1 solution of formalin in methanol, acidified with a small quantity of hydrochloric acid, for a few minutes.

BEST MODE

The following are illustrative examples of the invention in which all parts and percentages are by weight and all degrees are Celsius unless otherwise stated.

The glycerol monomethacrylate used in these examples was prepared by the following procedure. A 500 ml resin kettle was fitted with a vibromixer stirrer, a gas inlet tube, a thermocouple probe, and a simple still head. The reactor was heated by a mantle controlled by a thermoregulator. Into the reactor were placed 150 grams (1.63 moles) of glycerol and 3.0 grams of sodium methoxide. The materials were mixed until all the methoxide was dissolved, and then 0.5 gram of p-methoxyphenol and 200 grams (2.0 moles) of methyl methacrylate were added. The heterogeneous mixture was heated to 75° and air was bubbled gently through it for four hours. During this time the reaction mixture became increasingly clear and a mixture of methanol and methyl methacrylate was slowly distilled from the reactor. After the first 2-hour period an additional 3.0 grams of sodium methoxide was added. After the second 2-hour period the reaction was terminated by adding 7 grams of acetic acid, and a total of 51 g of methyl methacrylate had been recovered. This corresponded ideally to a 92% yield of mono-addition product and 8% of unreacted glycerol. The reaction mixture was cooled to room temperature and then extracted with petroleum ether to remove unreacted methyl methacrylate. A 0.2-gram portion of hydroquinone was added and the petroleum ether was removed by distillation at reduced pressure. The product was a clear transparent liquid. NMR analysis in acetone-$d_6$ showed that the product contained 89% ester and 11% unchanged glycerol. The analysis indicated that 96% of the ester product was glycerol monomethacrylate and the remaining 4% was a saturated ester obtained by Michael addition of glycerol to methyl methacrylate. The product was stored in a refrigerator prior to use.

EXAMPLE 1

A. Carbamation of Poly(Vinyl Alcohol)

A 1-liter resin kettle reactor was fitted with a vibromixer stirrer, an inlet for a nitrogen sweep, a thermocouple probe and an ammonia outlet. The kettle was heated by a heater muff whose temperature was controlled by a thermoregulator connected to the thermocouple probe immersed within the reaction mixture. Into the reactor kettle was placed 400 g of urea, the regulator temperature was set to 155° and heating was commenced. When the urea had melted, 100 g of poly(vinyl alcohol), 99% hydrolyzed, number average molecular weight (Mn) about 10,000, and 5 g of zinc acetate were added to the reactor. The temperature was allowed to climb to 160° and the reaction run for 4 hours. Vigorous stirring was necessary to prevent a crust from forming on the reaction mixture and also to help the continued release of ammonia. The reaction mixture was cooled to about 120° and the product was recovered by slowly pouring the mixture into 3 liters of rapidly stirred methanol in a blender. After extensive stirring, the essentially soluble product was coagulated by adding 500 ml of acetone. The mixture was then decanted, washed again with a methanol/acetone mixture, and finally with acetone to harden the polymer. The final product was filtered and dried unter dry nitrogen. C, H, N analysis showed that the product contained approximately 52 mole percent carbamate groups. (Carbon 45.31, 45.52; Hydrogen, 7.32, 7.67; Nitrogen, 10.68, 10.79). Calculations based on carbon/hydrogen analyses were in essential agreement with those based on the nitrogen analyses.

Equations which can be employed for the calculations based on nitrogen analyses are as follows:
$\alpha$ = mole fraction hydroxyl groups
$\beta$ = mole fraction carbamate groups
$\alpha = 1 - \beta$ $$\beta = \frac{44 \, (\%N)}{1400 - 43 \, (\%N)}$$

B. Preparation of Photosensitive Composition

A small laboratory jacketed, pressure, mixing reaction vessel (Atlantic Helicone ® Reactor) was heated by means of a circulating oil bath to 135° (head temperature). Into the mixer was placed 35 g of glycerol monomethacrylate and 0.5 g of benzophenone. To this mixture was then added 30 g of the carbamated poly(vinyl alcohol) described in part A. The mixture was blended for about 10 minutes until a uniform composition was obtained. During the mixing period the reactor was evacuated to remove dissolved gases from the composition. Air was allowed back into the reactor and samples were extruded onto oriented polyester sheet substrates at 3-minute intervals. Three samples in total were extruded, and the polymer was evacuated between each extrusion. Each clear molten polymer sample was in turn pressed into 67-mil (1700 $\mu$m) thick bubble-free plates using spacers and a perfluorinated ethylene/propylene copolymer cover sheet. The samples were pressed between glass plates to provide uniform pressure to the molten compositions, and pressure was retained for about 15 seconds until the samples had cooled sufficiently to become dimensionally stable. The samples were stored in a dark container and they remained transparent.

A plate was back-exposed to radiation from a 275-watt sunlamp for 15 seconds through the polyester substrate at a distance of 12 inches (30.5 cm) followed by a 10-minute direct exposure without the cover sheet in air through a contact negative process transparency. The plate was spray-developed with an aqueous solution of 9% potassium chloride/1% potassium hydroxide followed by a water rinse. The dried plate was post-exposed with the sunlamp for 10 minutes to make the background areas more rigid. A tough flexible plate was obtained which exhibited satisfactory relief. It had a Shore A hardness of 85.

EXAMPLE 2

A. Carbamation of Poly(Vinyl Alcohol)

A 4-liter resin kettle reactor was equipped as described in Example 1, and it was charged with 1000 ml of dimethylformamide (DMF) and 300 g of poly(vinyl alcohol), 99% hydrolyzed and $Mn \sim 10,000$. The mixture was heated to 145° to dissolve the poly(vinyl alcohol) and to distill out volatile impurities, and the mixture was flushed with a stream of dry nitrogen. A total of 800 g of urea and 5 g of zinc acetate were added, and the reaction mixture was heated at 155° for 4 hours. The product was cooled to 100°, divided in half, and each half vigorously mixed with 2500 ml of methanol in a blender. The resulting gelatinous precipitate was further coagulated by addition of 500 ml of acetone. The product was decanted, rewashed with acetone/methanol, filtered and dried under circulating dry nitrogen. Elemental analysis showed that the polymer contained 34 mole percent carbamate groups.

Anal. Found: C, 49.41, 49.11; H, 8.16, 8.51; N, 9.62, 9.64.

B. Preparation of Photosensitive Composition

To the reaction vessel of Example 1B, heated at 135°, were added 18 g of glycerol monomethacrylate, 20 g of glycerol and 0.5 g of benzophenone. To this hot mixture was added 25 g of the carbamated poly(vinyl alcohol) of part A, the reaction mixture was heated at 135° for 10 minutes to effect blending, and photosensitive elastomeric elements on oriented polyester sheet substrates were prepared as described in Example 1.

The plates were exposed to radiation as described in Example 1, and they were spray-developed with a 10% aqueous potassium chloride solution. The dried plates were postexposed as described in Example 1. They showed moderately good resolution and relief, but they were soft. The unexposed areas of the plates were tacky, apparently because of high glycerol plasticizer content.

Part B was repeated with 35 g of glycerol monomethacrylate, 0.5 g of benzophenone and 25 g of the carbamated poly(vinyl alcohol) of part A. No glycerol was added. Clear, translucent, dimensionally stable, elastomeric elements were obtained. The plates were exposed to radiation, developed, and postexposed as described in Example 1. Tough, resilient plates which showed excellent resolution and relief were obtained, Shore A hardness = 79–81.

EXAMPLE 3

To the reaction vessel of Example 1B, heated at 155° head temperature, were added 40 g (0.67 mole) of urea, 5 g (0.1136 mole) of poly-(vinyl alcohol), 99% hydrolyzed and Mn about 60,000, 20 g of poly(vinyl alcohol), 99% hydrolyzed and Mn about 10,000, 2 g of zinc acetate, and 10 g of polyamide molding resin. The reaction mixture was heated at 155° for 40 minutes, cooled to 150°, and a mixture of 46 g (0.288 mole) of glycerol monomethacrylate and 0.5 g (0.0028 mole) of benzophenone was added and blending continued for 10 minutes. The reaction mixture was transferred to an aluminum pan and cooled to give a tough, rubbery, dimensionally stable composition. Photosensitive elements were prepared by pressing films at 100° and 120° with 12-mil (305 μm) and 67-mil (1700 μm) spacers using an oriented polyester film substrate and a perfluorinated ethylene/propylene copolymer cover sheet. The cover sheet was easily removed from both exposed and unexposed elements.

The plates were exposed to radiation as described in Example 1, and they were spray-developed with a 10% aqueous potassium chloride solution. The plates were rinsed in a 1/1 alcohol/water solution, dried, and post-exposed as described in Example 1. The exposed plates showed good resolution and image relief.

EXAMPLE 4

To the reaction vessel of Example 1B, heated to 155° head temperature, were added 40 g of urea, 25 g of poly(vinyl alcohol), 99% hydrolyzed and $Mn \sim 10,000$, and 2 g of zinc acetate, and the mixture was heated for 30 minutes and cooled by transfer to a glass plate. A total of 26 g of the reaction mixture was returned to the reactor, heated to 155°, and 150 ml of DMF was added, and the mixture was heated for 10 minutes to effect blending. It was slowly poured into acetone in a blender to precipitate the polymer. The white, powdery polymer was washed with acetone and dried (carbamated reference polymer).

A second 26 g portion of the original reaction mixture was returned to the reactor, heated to 155° to effect melting, and 26 g of glycerol monomethacrylate was added. The mixture was blended for 20 minutes, 150 ml of DMF was added, and the mixture was stirred for 10 minutes until it was completely fluid. The polymer was precipitated in acetone, washed with additional acetone and dried under nitrogen (grafted photosensitive polymer).

Reference Polymer Analysis Found: C, 47.46, 47.68; H, 8.72, 8.73; N, 4.35, 4.20.

Photosensitive Polymer Analysis Found: C, 49.42, 49.64; H, 8.43, 8.28; N, 3.97, 3.99.

The analyses show that the reference polymer contains 26 mole percent carbamate groups and 74 mole percent hydroxyl groups. The grafted photosensitive polymer contains 74 mole percent hydroxyl groups, 21 mole percent carbamate groups and 5 mole percent grafted glycerol methacrylate groups which corresponds to 20% of the available carbamate groups converted to grafted glycerol methacrylate ester groups.

Tests for unsaturation using potassium permanganate were negative for the reference polymer but strongly positive for the photosensitive polymer.

EXAMPLE 5

A 4-liter resin kettle reactor was equipped as described in Example 1, and it was charged with 1000 ml of DMF and 800 g of urea. The mixture was heated to 155°, and 250 g of poly(vinyl alcohol), 99% hydrolyzed and Mn~60,000, and 3 g of zinc acetate were added. The mixture was heated at 155° for 2.5 hours, and the polymer was precipitated by pouring it slowly into a 1/1 mixture of acetone and methanol in a blender. The polymer was washed with additional acetone/methanol followed by an acetone wash, and it was dried under nitrogen.

Anal. Found: C, 48.12, 48.46; H, 8.26, 8.38; N, 8.70 (average). The analysis shows that the polymer contains 66 mole percent hydroxyl groups and 34 mole percent carbamate groups.

To the reaction vessel of Example 1B, heated to 155° head temperature, were added 25 g of the carbamated poly(vinyl alcohol), 100 ml of DMF and 2 g of zinc acetate. After the ingredients were molten, 20 g of hydroxyethyl methacrylate was added. Reaction was continued for 30 minutes at 155°, and the polymer was precipitated by slowly pouring it into acetone in a blender. The polymer was washed with acetone and dried under nitrogen. The grafted polymer was soluble in aqueous acetone/methanol but poorly soluble in water.

Anal. Found: C, 49.55, 49.55; H, 7.59, 8.10; N, 4.43, 4.09. The analysis shows that about 27 percent of the available carbamate groups were converted to grafted hydroxyethyl methacrylate ester groups.

EXAMPLE 6

A photosensitive polymer composition was prepared essentially as described in Example 3 except that 15 g of polyamide molding resin was added and reaction of glycerol monomethacrylate with the carbamated poly(vinyl alcohol) polymer was allowed to proceed for 15 minutes.

The 67-mil (1700-μm) plates were exposed to radiation as described in Example 1, and they were spray-developed with a 10% aqueous potassium chloride solution followed by rinsing with a 2/1 water/2-propanol solution. The dried plates were post-exposed as described in Example 1, and all plates exhibited excellent resolution and relief. The Shore A hardness measured on a rubber pad backing was 56 and measured on a glass backing was 64.

EXAMPLE 7

To the reaction vessel of Example 1B, heated to 155° head temperature, were added 40 g of urea, 25 g of poly(vinyl alcohol), 99% hydrolyzed and Mn about 60,000, and 2 g of zinc acetate, and the reactants were heated for 40 minutes at 155°. Then 45 g of glycerol monomethacrylate and 0.5 g of benzophenone were added, reaction was continued for 15 minutes at 155°, and polymer samples, 67 mils (1700 μm) in thickness, were extruded onto oriented polyester sheets as described in Example 1.

One of the extruded polymer samples was cut into small pieces, and 4-mil (102-μm) films were pressed at 120°. Both thick and thin photosensitive polymer films, without cover sheets, were exposed to 365 nm radiation at calibrated exposure levels in a spectrosensitometer which permits accurate measurement of exposure energies at very narrow wavelength bands. Polymer films were exposed with and without oriented polyester film cover sheets, under vacuum, and in helium and air. Samples were developed by washing with water. All samples of a given thickness showed essentially the same photosensitivity under all exposure conditions.

EXAMPLE 8

To the reaction vessel of Example 1B, heated to 165° head temperature, were added 30 g of urea, 10 g of poly(vinyl alcohol), 99% hydrolyzed and Mn about 10,000, and 1 g of zinc acetate, and the reaction mixture was heated at 165° for 30 minutes. Then 39 g of glycerol monomethacrylate and 0.5 g of benzophenone were added, reaction was continued for 15 minutes at 165°, and the product was poured onto a sample of oriented polyester film and cooled. A portion of the polymer product was remelted at 80° and pressed into 67-mil (1700-μm) plates on an oriented polyester film substrate. The plates were exposed for 2 and 10 minutes to radiation in air and developed as described in Example 1. Good images which showed good resolution and relief were obtained at both exposures.

An attempt to effect photopolymerization of molten photosensitive composition in air at 100° did not give polymerization.

EXAMPLE 9

Into a beaker immersed in an oil bath set at 160° was charged 123 g of urea. After the urea had melted, 50 g of poly(vinyl alcohol), 99% hydrolyzed and Mn about 100,000, and 2 g of zinc acetate were added, and the mixture was stirred for 1 hour. A total of 84 g of glycerol was charged and the reaction mixture was stirred for 1 hour. Finally, 33 g of hydroxypropyl methacrylate and 1.5 g of benzophenone were added, the mixture was stirred for 30 minutes at 160°, and the product was poured onto glass plates covered with an oriented polyester film. The polymer composition was covered with a polyethylene film cover sheet, and the mixture was pressed into 67-mil (1700-μm) plates. The plates were exposed for 2 minutes with a black backing to radiation as described in Example 1, and they were developed by washing with water. The dried plates were postexposed as described in Example 1, and tough, highly elastomeric, plates with good resolution were obtained.

EXAMPLE 10

Into a beaker immersed in an oil bath set at 180° were charged 50 g of low molecular weight poly(vinyl alcohol), Mn about 10,000, which contained 12 mole percent acetate groups, 100 g of urea, 30 g of glycerol and 2 g of zinc acetate. The mixture was stirred at 180° for 3 hours, and 20 g of hydroxypropyl methacrylate and 1.5 g of benzophenone were added. Reaction was continued for 1 hour, and the hot polymer was cast onto a glass plate with a doctor knife to give a coating of about 50 mils (1270-μm) in thickness. The plate was exposed for 10 minutes to radiation as described in Example 1, and the image was developed by washing with water. A good image was formed.

EXAMPLE 11

Into a beaker immersed in an oil bath set at 180° were charged 127 g of urea and 30 g of glycerol. After the mixture was fluid, 50 g of poly(vinyl alcohol), 99% hydrolyzed and Mn about 60,000, and 2 g of zinc acetate were added, and the reaction was continued for an additional 3.25 hours with the addition of a 30-ml portion of glycerol after 2.5 hours and additional 40-ml portion of glycerol after 2.75 hours, respectively. The reaction mixture was poured into a crystallizing dish and cooled.

Two portions of the polymer were blended at 50° on a rubber mill with 10 and 20 percent triethylene glycol diacrylate and with 2 percent of benzoin isobutyl ether photoinitiator added in each case. The milled compositions were pressed into elastomeric plates at 120°. The clear transparent plates were exposed through a process transparency for 5 minutes in air to a 275-watt sunlamp at a distance of 12 inches (30.5 cm), and the exposed plates were developed by spraying with water. Relief images with good resolution and relief were obtained. The plates were postexposed as described in Example 1 and inked with a standard black ink. Good hand prints were obtained by pressing the inked plates with paper.

EXAMPLE 12

Rate Study: Carbamation of Poly(Vinyl Alcohol)

To the reaction vessel of Example 1B, heated to 155° head temperature, was added 250 g of urea. When the urea had melted, 25 g of poly(vinyl alcohol), 99% hydrolyzed and Mn about 60,000, and 4 g of zinc acetate were added. The time of addition of the poly(vinyl alcohol) was taken as zero reference time. Samples were removed at 30-minute intervals. The reaction product in each case was precipitated by pouring the sample into a blender which contained a 2/1 acetone/methanol mixture. The precipitated polymer was washed with additional acetone/methanol solution and dried at reduced pressure under a warm stream of nitrogen. Degree of carbamation was determined by nitrogen analysis, and the results are summarized in Table I.

TABLE I

| Sample | Time, hrs. | % N | β | α |
|---|---|---|---|---|
| 1 | 0 | — | — | 1 |
| 2 | 0.5 | 4.56 | 0.167 | 0.833 |
| 3 | 1.0 | 5.73 | 0.219 | 0.781 |
| 4 | 1.5 | 7.04 | 0.282 | 0.718 |
| 5 | 2.0 | 8.36 | 0.353 | 0.647 |
| 6 | 2.5 | 11.62 | 0.568 | 0.432 |
| 7 | 3.0 | 14.78 | 0.851 | 0.149 |
| 8 | 3.5 | 17.73 | 1.223 | — |
| 9 | 4.0 | 16.09 | 0.999 | 0.001 |

$$\frac{1}{\beta} = \frac{31.82}{[\%N]} - 0.9773; \alpha = 1 - \beta$$

β = mole fraction carbamate groups;
α = mole fraction hydroxyl groups.

EXAMPLE 13

Rate Study: Grafting of Carbamated Poly-(Vinyl Alcohol) With Propylene Glycol

To the reaction vessel of Example 1B, heated to 155° head temperature, was added 200 g of urea, 40 g of poly(vinyl alcohol), 99% hydrolyzed and Mn about 10,000, and 2 g of zinc acetate. Reaction was continued for 2 hours followed by the addition of 150 ml of dimethylformamide. The solution was slowly poured into a rapidly stirred solution of 2/1 acetone/methanol. The precipitated polymer was washed with additional acetone/methanol solution and dried under nitrogen. Carbon, hydrogen and nitrogen analysis showed that 23 mole percent of the available hydroxyl groups had been carbamated.

Thirty grams of the carbamated polymer and 100 ml of DMF were charged into the reaction vessel at 155°. When the polymer had dissolved, 2 g of zinc acetate and 52 g of propylene glycol were added rapidly. An initial 10 ml sample of product was taken immediately, and the polymer was precipitated by pouring it into acetone. Additional samples were taken at 15-minute intervals. The precipitated polymer samples were washed with acetone, dried extensively under nitrogen, and analyzed (carbon, hydrogen, nitrogen) to determine the extent of grafting. The results are summarized in Table II. About 50 percent of the available carbamate groups were grafted within 1¼ hours under the conditions of the experiment.

TABLE II

| Sample | Time (min) | % N[(1)] | γ | α | β |
|---|---|---|---|---|---|
| Base Polymer | 0 | 5.16 | — | 0.767 | 0.233 |
| 1 | 0 | 4.51 | 0.0474 | 0.767 | 0.183 |
| 2 | 15 | 3.73 | 0.0747 | 0.767 | 0.155 |
| 3 | 30 | 3.97 | 0.0661 | 0.767 | 0.164 |
| 4 | 45 | 3.21 | 0.0938 | 0.767 | 0.136 |
| 5 | 60 | 2.93 | 0.1043 | 0.767 | 0.126 |
| 6 | 75 | 2.58 | 0.1179 | 0.767 | 0.122 |

[(1)]The values are the average of two determinations.
α = mole fraction hydroxyl groups;
β = mole fraction carbamate groups;
γ = mole fraction carbonate grafted groups.

The following equations were used to calculate the α, β and γ values shown in Table II from the nitrogen analyses.

Reference-Base Polymer $$\gamma_{ref} = 0$$

$$\beta_{ref} = \frac{44 \, (\%N)}{1400 - 43 \, (\%N)}$$

$$\alpha_{ref} = 1 - \beta_{ref}$$

Grafted Samples $$\alpha = 1 - \beta_{ref}$$

$$\gamma = \frac{1400(1 - \alpha) + (43\alpha - 87)[\%N]}{1400 + 59[\%N]}$$

$$\beta = (1 - \alpha) - \gamma$$

EXAMPLE 14

To the reaction vessel of Example 1B, heated at 155° head temperature, were added 160 g of urea, 20 g of poly(vinyl alcohol), 99% hydrolyzed and Mn about 60,000, 80 g of poly(vinyl alcohol), 99% hydrolyzed and Mn about 10,000, 5 g of zinc acetate and 20 g of polyamide molding resin. The reaction mixture was heated at 155° for 40 minutes, and 40 g of glycerol was added. Reaction was continued for an additional 40 minutes at 155°, and then poured slowly into an aluminum storage container, yield, 275 g.

A portion of the glycerol monomethacrylate prepared above was further purified by extraction with acetone to remove unreacted glycerol. The glycerol was insoluble in acetone while the glycerol monomethacrylate was soluble. The acetone was removed from the monomethacrylate by distillation at reduced pressure.

To the reaction vessel, heated to 135° head temperature, were added 30 g of purified glycerol monomethacrylate and a solution of 0.5 g of benzophenone in 50 ml of methanol. The temperature was lowered to about 100°, 40 g of the carbamated binder was added, and the reaction mixture was blended for 5 minutes at 100° and 5 minutes at 100°–135°. The re-reaction mixture was evacuated and samples were extruded onto oriented polyester film substrates, and photosensitive elastomeric elements were prepared as described in Example 1. The cooled samples were slightly translucent.

The plates were exposed through a contact negative for periods of 5 and 10 minutes to a 275 watt sunlamp placed 12 inches (30.5 cm) from the samples as described in Example 1. The samples were developed by spraying with a 10% aqueous potassium chloride solution followed by drying and postexposure as described in Example 1. The postexposed plates were soaked for 3 minutes in a 2/1 methanol/formalin solution which had been acidified with a few drops of hydrochloric acid. After drying, a tough resilient plate was obtained.

INDUSTRIAL APPLICABILITY

The printing reliefs made in accordance with this invention can be used in all classes of printing, but are most applicable to those classes of printing wherein a distinct difference of height between printing and non-printing areas is required, and particularly to the flexographic printing class wherein a resilient print area is required, e.g., for printing on deformable printing surfaces. These classes include those wherein the ink is carried by the raised portion of the relief such as in dry-offset printing, ordinary letterpress printing, the latter requiring greater height differences between printing and nonprinting areas, and those wherein the ink is carried by the recessed portions of the relief such as in gravure and intaglio printing, e.g., line and inverted half-tone. The plates are also useful for multicolor printing, and they are particularly useful with hydrocarbon-based inks.

The photosensitive compositions of this invention are also useful in the preparation of photoresists for etching, gravure, planograph plates, semiconductor wafers, and screens for "silk screen" printing or as stencils. The compositions can be coated onto printing cylinders, e.g., plastic or metal cylinders, or attached thereon as photosensitive elastomeric layers.

The photosensitive compositions are suitable for other purposes, in addition to the printing uses described above, in which readily insolubilized, solid, addition polymerizable compositions are useful, e.g., for making ornamental plaques or for producing ornamental effects; for making patterns for automatic engraving machines, foundry molds, cutting and stamping dyes; for name stamps; for relief maps; for gaskets; as rapid cure coatings, e.g., on film base, on rollers, inside tanks; in the preparation of printed and microelectronic circuits; for affixing phosphors to surfaces to provide color television screens; and in the preparation of other plastic or elastomeric articles.

I claim:

1. A photopolymerizable elastomeric composition which comprises, based on the total composition:

(1) 15 to 89 percent by weight of a carbamated poly(vinyl alcohol) polymeric binder wherein
  (a) 15 to 100 mole percent of the recurring units in said binder have the formula

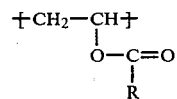

wherein R is $NH_2$ in some recurring units and at least one of $OR^1$ and $NHR^1$ in the remaining recurring units wherein $OR^1$ is the residue remaining after removal of a hydrogen atom from an alcohol which has a boiling point of greater than 100° C. at normal atmospheric pressure, with the proviso that said alcohol is compatible with said polymeric binder, and the ratio of $(OR^1 + NHR^1)/NH_2$ is within the range of 0.05 to 1.0, and
  (b) 0 to 85 mole percent of the recurring units in said binder have a formula selected from the group consisting of

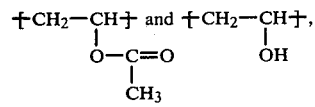

with the proviso that no more than 12 mole percent of the recurring units in said binder have the formula

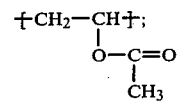

(2) 10 to 70 percent by weight of a nongaseous, ethylenically unsaturated compound containing at least one terminal ethylenic group, said compound being capable of forming a high polymer by radical initiated chain-propagating addition polymerization, and being compatible with polymeric binder (1); and (3) 0.1 to 10 percent by weight of a thermally stable, radiation-sensitive, radical generating system, activatable by actinic radiation, which initiates polymerization of the unsaturated compound.

2. The photopolymerizable elastomeric composition of claim 1 wherein the composition contains 30 to 70 percent by weight of carbamated poly(vinyl alcohol) polymer binder, 20 to 40 percent by weight of ethylenically unsaturated compound having a boiling point of greater than 100° C. at atmospheric pressure, and 0.2 to 1 percent by weight of radical generating system.

3. The photopolymerizable elastomeric composition of claim 2 wherein 30 to 50 mole percent of the recurring units in said binder have the formula

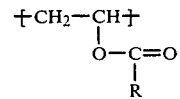

the ratio of $(OR^1+NHR^1)/NH_2$ is within the range of 0.1 to 0.3, and 50 to 70 mole percent of the recurring units in said binder have a formula selected from the group consisting of

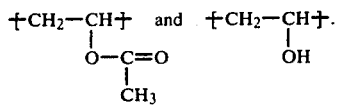

4. A photopolymerizable element which comprises a substrate coated to a thickness of 0.5 to 250 mils with a photosensitive elastomeric composition which comprises, based on the total composition:
   (1) 15 to 89 percent by weight of a carbamated poly(vinyl alcohol) polymeric binder wherein
      (a) 15 to 100 mole percent of the recurring units in said binder have the formula

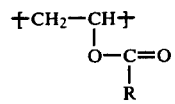

wherein R is $NH_2$ in some recurring units and at least one of $OR^1$ and $NHR^1$ in the remaining recurring units wherein $OR^1$ is the residue remaining after removal of a hydrogen atom from an alcohol which has a boiling point of greater than 100° C. at normal atmospheric pressure, with the proviso that said alcohol is compatible with said polymeric binder, and the ratio of $(OR^1+NHR^1)/NH_2$ is within the range of 0.05 to 1.0, and
      (b) 0 to 85 mole percent of the recurring units in said binder have a formula selected from the group consisting of

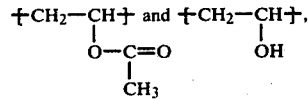

with the proviso that no more than 12 mole percent of the recurring units in said binder have the formula

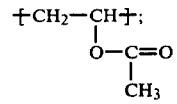

(2) 10 to 70 percent by weight of a nongaseous, ethylenically unsaturated compound containing at least one terminal ethylenic group, said compound being capable of forming a high polymer by radical initiated chain-propagating addition polymerization, and being compatible with polymeric binder (1);
   (3) 0.1 to 10 percent by weight of a thermally stable, radiation-sensitive, radical generating system, activatable by actinic radiation, which initiates polymerization of the unsaturated compound.

5. The photopolymerizable element of claim 4 wherein the photosensitive elastomeric composition contains 30 to 70 percent by weight of carbamated poly(vinyl alcohol) polymeric binder, 20 to 40 percent by weight of ethylenically unsaturated compound having a boiling point of greater than 100° C. atmospheric pressure, and 0.2 to 1 percent by weight of radical generating system.

6. The photopolymerizable element of claim 5 wherein 30 to 50 mole percent of the recurring units in said binder have the formula

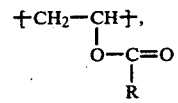

the ratio of $(OR^1+NHR^1)/NH_2$ is within the range of 0.1 to 0.3, and 50 to 70 mole percent of the recurring units in said binder have a formula selected from the group consisting of

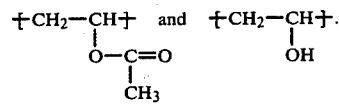

* * * * *